United States Patent [19]

Wong et al.

[11] 3,713,046

[45] Jan. 23, 1973

[54] WAVEFORM GENERATOR WITH ACCURATE MARK TO SPACE RATIO

[75] Inventors: Cho Lun Wong, Ottawa, Ontario; Glenson Trevelyn Jones, Kanata, Ontario; Roland Francis Crawford, Ottawa, Ontario, all of Canada

[73] Assignee: Northern Electric Company Limited, Montreal, Quebec, Canada

[22] Filed: Feb. 22, 1972

[21] Appl. No.: 228,194

[52] U.S. Cl.....................331/111, 331/108 D, 331/51

[51] Int. Cl.....................H03k 3/282

[58] Field of Search....................331/108, 111, 143, 51

*Primary Examiner*—John Kominski

*Attorney*—Alfred A. DeLuca

[57] ABSTRACT

An operational amplifier, arranged to function as a free running rectangular waveform oscillator is coupled to a binary counter via an electronic gate. A transistor switch, which is controlled by one output of the binary counter, is used to alternately change the period of successive cycles generated by the rectangular waveform oscillator. When the electronic gate is enabled a waveform is generated at the output of the binary counter with a mark-to-space ratio dependent on the ratio of the alternate periods of the rectangular waveform oscillator.

5 Claims, 2 Drawing Figures

WAVEFORM GENERATOR WITH ACCURATE MARK TO SPACE RATIO

FIELD OF THE INVENTION

This invention relates to waveform generators of the type normally used in an electronic telephone office and more particularly to a waveform generator for generating a waveform with a stable and accurate mark-to-space ratio.

DESCRIPTION OF THE PRIOR ART

In the field of telphony, particularly in electronic switching offices, it is occasionally necessary to generate waveforms with closely controlled mark-to-space ratios. In the Stored Program Electronic Switching System (SP1-ESS), for example, a circuit known as a dial pulse transmitter (this circuit forms part of the Receiver/Sender Circuit) is used to generate a waveform with a closely controlled mark-to-space ratio. The Stored Program Electronic Switching System (SP1-ESS) is described in the technical journal TELESIS, Volume 1, No. 4, published by the Northern Electric Company Limited at pages 120 to 125 and pages 134 to 138.

Although several methods of generating waveforms with uneven or unequal mark-to-space ratios are currently used, each method has certain advantages and disadvantages.

If, for example, a waveform with a 58 percent mark (42 percent space) is required at a frequency of 10Hz the following method can be used. A 20Hz rectangular wave source is initially fed into a divide -by- two circuit to generate a 10Hz waveform with a unity mark-to-space ratio (50 percent mark and 50 percent space). Each mark pulse is then stretched from 50 percent to 58 percent by adding a 8 millisecond pulse (corresponding to 8 percent) to its trailing edge. To accomplish this last step the trailing edge of each mark pulse could be made to trigger a 8 millisecond monostable circuit. By ORing the output of the monostable circuit and the mark pulse, the 58 percent mark waveform at 10Hz can be generated. The accuracy of the mark-to-space ratio of the waveform generated by the aforementioned method is of the order of ±1 percent which is unsuitable for certain critical applications.

An alternative and more precise method would be to use a system of frequency division. If a 59 percent mark were desired, for example, a 320Hz clock and a five stage binary counter could be used to generate a waveform with a highly accurate 59.375 percent mark interval by suitable logical combinations of the outputs of various stages of the five stage binary counter.

SUMMARY OF THE INVENTION

A waveform generator has been invented which is capable of generating a waveform with a stable and accurate mark-to-space ratio. This waveform generator is relatively insensitive to temperature and supply voltage variations, (typically 0.1 percent variation in mark-to-space ratio over a supply voltage range of from 20 to 27 volts), relatively simple in design and construction, and capable of generating waveforms with a wide range of mark-to-space ratios. If desired the mark-to-space ratio may be readily changed by simply changing the time constant of a portion of the waveform generator internal circuitry.

Thus in accordance with the present invention the waveform generator comprises an oscillator for generating a periodic signal voltage and a frequency divider circuit having an input terminal and an output terminal. The input terminal of the frequency divider circuit is arranged so as to be responsive to the signal voltage generated by the oscillator. A waveform having both mark and space durations appears at the output terminal. A switch means having a conducting and a non-conducting state, and a control element for selecting one of said states is connected to the output terminal of the frequency divider circuit. The state of conduction of the switch means changes in accordance with a change in voltage level appearing at the output terminal of the frequency divider circuit. As the state of the switch means is alternately changed from the conducting to the non-conducting state, means, controllable by the switch means, is provided for alternately changing the period of the periodic signal voltage from a first to a second period. With the waveform generator described above an output voltage is generated at the output terminal of the frequency divider circuit which has a rectangular waveform with a mark-to-space ratio dependent on the ratio of the first to second periods of the periodic signal voltage. The mark duration is an integral multiple of one oscillator period and the space duration is an integral multiple of the other oscillator period.

By connecting a logic gate between the oscillator and the frequency divider, the waveform generator can be turned on and off without cutting short the first pulse in an output pulse train. Also, by ORing a control input with the frequency divider output, the last output pulse cannot be cut short by removal of the control input.

BRIEF DESCRIPTION OF THE DRAWINGS

An example embodiment of the invention will now be described with reference to the following drawings in which.

DESCRIPTION OF ONE EMBODIMENT

Figure 1:
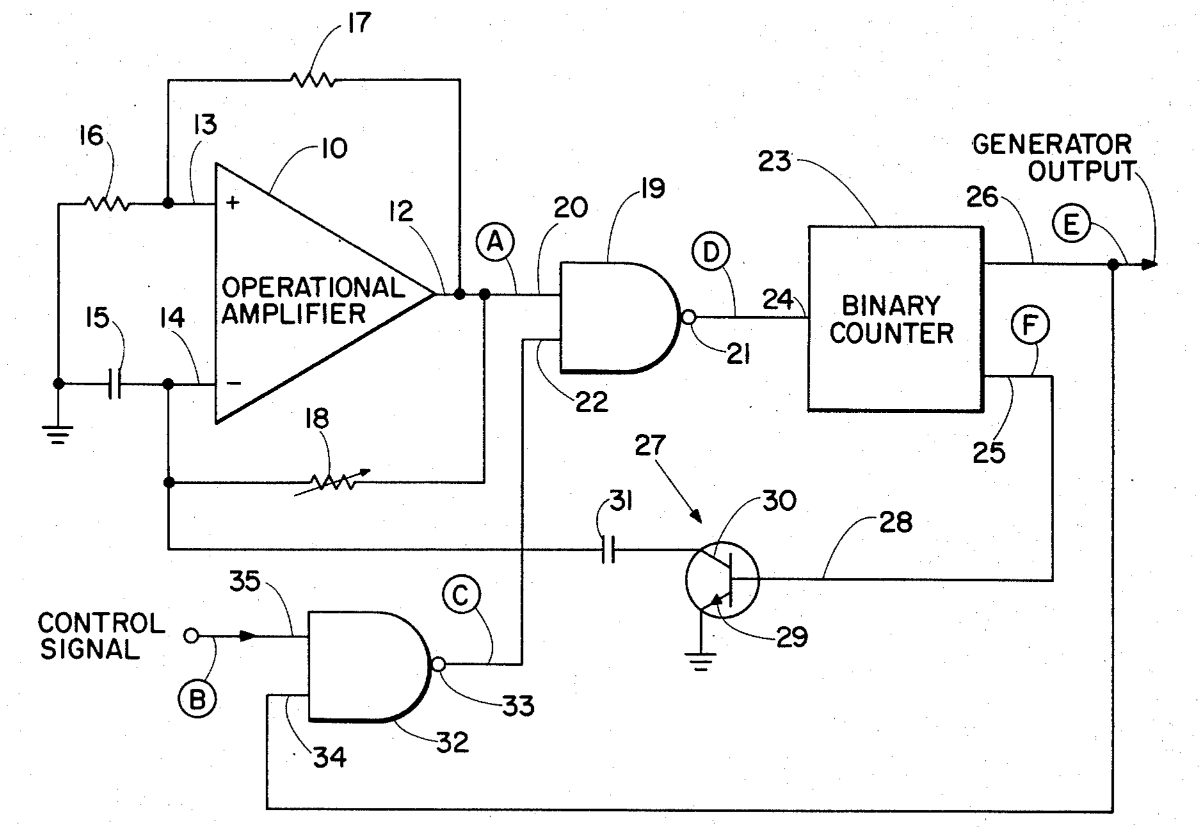
FIG. 1 is a schematic drawing of a waveform generator in accordance with the present invention.
Figure 2:
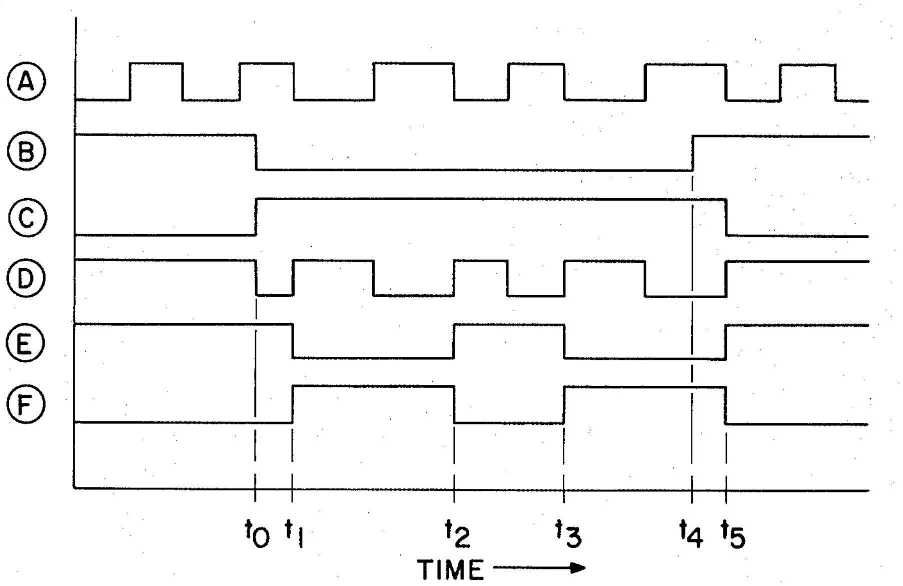
FIG. 2 illustrates typical waveforms appearing at locations (A), (B), (C), (D), (E), and (F) on the schematic drawing of FIG. 1.

With reference to FIG. 1 the waveform generator comprises an operational amplifier 10 arranged to oscillate and generate a rectangular waveform at its output terminal 12. A a typical waveform generated at output terminal 12 is illustrated by waveform (A) in FIG. 2. The operational amplifier 10 has a first input terminal 13 connected via a first resistor 16 to a common terminal represented by a ground potential and a second input terminal 14 connected to ground via a first capacitor 15. The first input terminal 13 is also connected to the output terminal 12 by a second resistor 17. The second input terminal 14 is also connected to the output terminal 12 of the operational amplifier via an adjustable third resistor 18. By changing the value of the first capacitor 15 and the third resistor 18 either singly or in combination the frequency of oscillation of the oscillator may be set as desired. The output terminal 12 of the operational amplifier 10 is connected to one input 20 of a first dual input NAND gate 19. This dual input NAND gate 19 has an output terminal 21 which is connected to input terminal 24 of the binary counter 23. Binary counter 23 corresponds to a divide by 2 frequency counter. A typical waveform appearing at the input terminal 24 of the binary counter 23 is illustrated in FIG. 2 by waveform (D). The binary counter 23 has two output terminals, a counter first output terminal 25 and a counter second output terminal 26. Counter output terminals 25 and 26 are conjugate output terminals as the waveforms appearing at these terminals (25 and 26) during operation, are 180° out-of-phase with respect to each other.

The voltage waveform appearing at the second output terminal 26 of the binary counter 23 is illustrated by waveform (E) in FIG. 2. This waveform (E) is the desired output waveform. The binary counter 23 will usually require only a single stage. If, however, the frequency of oscillation of the operational amplifier 10 is $n$ ($n$ is an even integer $> 2$) times greater than the frequency of the waveform which is to appear at the output terminal 26 of the binary counter 23, the binary counter required must be able to divide by $n$. If n is an odd integer a different form of frequency divider will be required as binary counters are unsuitable for frequency division by odd numbers.

The first output terminal 25 of the binary counter 23 is connected to the base 28 of a transistor switch 27. The emitter 29 of the transistor switch 27 is connected to the common terminal or ground potential while the collector 30 of said switch 27 is connected via a second capacitor 31 to the second input terminal 14 of the operational amplifier 10.

The waveform generator also includes a second dual input NAND gate 32 to start and stop said generator as desired. Although the oscillator, which is used to generate the signal voltage appearing at output terminal 12 of the operational amplifier 10 is free running, the appearance of the desired waveform at the first 25 and second 26 output terminals of the binary counter 23 is subject to the logic state of the second dual input NAND gate 32 in conjunction with the logic state of first dual input NAND gate 19.

The second dual input NAND gate 32 has an output terminal 33 which is connected to the first dual input NAND gate 19 at input terminal 22. In addition the second dual input NAND gate 32 has a first input gate terminal 34 and a second input gate terminal 35. The first input gate terminal 34 of the dual input NAND gate 32 is connected to the counter second output terminal 25, and the second input gate terminal 35 of said NAND gate 32 is provided for connection to a control signal.

A typical waveform of the control signal applied to the second input gate terminal 35 of the second dual input NAND gate 32 is illustrated by waveform (B) in FIG. 2. The waveform appearing at the output terminal 33 of the second dual input NAND gate 32 is illustrated by waveform (C) in FIG. 2.

In FIG. 1 of the drawings, the source of control signals is not shown, furthermore the usual positive and negative supply voltages are omitted for clarity, and only the common terminal or ground potential (represented by the conventional ground symbol) is shown).

OPERATION OF THE DESCRIBED EMBODIMENT

In normal operation of the circuit illustrated in FIG. 1, the desired output waveform appears at the counter second output terminal 26, when the required control signal is applied to the second input terminal 35 of the second dual input NAND gate 32. Typical waveforms for the control signal (B) and the desired output waveform (E) are illustrated in FIG. 2.

Operational amplifier 10 along with first 16, second 17 and third 18 resistors and first capacitor 15 form a free running oscillator. The signal voltage generated by this free running oscillator appears at the output terminal 12 of the operational amplifier 10. This signal voltage has a rectangular waveform with a free running or first period dependent on first capacitor 15, third resistor 18, and the ratio of first 16 to second 17 resistors. The third resistor 18 is shown as a variable resistor to permit fine adjustment of the first or free running period. When a second capacitor 31 is connected in parallel with the first capacitor 15, in a manner as will be explained later, the period of the free running oscillator changes from the aforementioned first period to a second period. Both the first and second periods are illustrated by waveform (A) in FIG. 2. Referring to waveform (A) the first, second, fourth and sixth cycles have a duration corresponding to the first period, whereas the third and fifth cycles have a duration corresponding to the second period.

When a control signal (a logical "low" or "0") is applied to the second input 35 of the second dual input NAND gate 35 at time $t_o$ (see waveform (B) in FIG. 2) the potential at the output terminal 33 of the second dual input NAND gate 32 (waveform (C) in FIG. 2) rises (to a logical "high" or "1"). As a result of the interconnection of the first 19 and second 32 dual input NAND gates (hereinafter to be referred to as the first and second NAND gates) the potential at input 22 of the first NAND gate 19 rises to a high or 1. Whenever the signal voltage generated at the output terminal 12 of the oscillator is high the first NAND gate 19 will pass this signal voltage in inverted form over to the input terminal 24 of the binary counter 23. Thus the first NAND gate 19 gates the signal voltage generated by the oscillator to the input terminal 24 of the binary counter 23 only when a low control signal is applied to the second input terminal 35 of the second NAND gate 32.

The binary counter 23 is of the type which responds to input signals appearing at its input terminal 24 at the positive slope portion of said signals. Accordingly, the binary counter 23 will switch at times $t_1$, $t_2$, $t_3$, and $t_5$ as waveform (D) of FIG. 2 undergoes a change from a low or 0 to a high or 1 at these times. When the waveform appearing at the first output terminal 25 of the binary counter 23 becomes positive, (for example at times $t_1$ and $t_3$ on waveform (F) in FIG. 2) the transistor switch 27 is turned ON and the second capacitor 31 is effectively placed in parallel with the first capacitor 15.

During the interval between times $t_1$ and $t_2$ the period of oscillation of the oscillator signal voltage is determined by the combined capacitance of the first capacitor 15 and the second capacitor 31. At time $t_2$ the binary counter 23 switches due to the positive slope of the waveform applied to the counter input terminal 24, and the voltage appearing at the counter first output thermal 25 drops to ground ("o"). Thus from time interval $t_2$ to $t_3$ transistor switch 27 is non-conducting and first capacitor 15 controls the period of the signal voltage generated by the oscillator. At time $t_3$ thebi-ary counter 23 switches and the transistor switch 27 is turned ON by the voltage rise at the first terminal 25 of the binary counter 23. From time $t_3$ to $t_5$ the frequency of the signal voltage is determined by the effective capacitance of the first 15 and second 31 capacitors.

From waveform (B) of FIG. 2 it can be seen that although the control signal was removed at time $t_4$, the generator output voltage (waveform (E)) continued until time $t_5$ at which time the last generated cycle was completed.

A study of waveform (E) of FIG. 2 reveals that the voltage applied to the first input 34 of the second NAND gate 32 (waveform (E)) remains at ground potential until time $t_5$ even though the control ground applied to the second input terminal 35 of said NAND gate 32 is removed at time $t_4$. The connection from the counter second output terminal 26 to the first input gate terminal 34 ensures that the last generated cycle is complete.

By proper selection of the values of the first 15 and second 31 capacitors a wide range of mark-to-space ratios may be obtained.

The mark-to-space ratio can be determined from waveforms (E) and (F) of FIG. 2 as the mark interval corresponds to the time interval between times $t_2$ and $t_3$, and the space interval corresponds to the time intervals between times $t_1$ and $t_2$ or $t_3$ and $t_5$.

Although the oscillator, which is used to generate the periodic signal voltage incorporates an operational amplifier, as illustrated in FIG. 1, other oscillator forms can be used if the frequency of the signal voltage is readily changeable. In the embodiment described the frequency is readily changed by changing the value of the first capacitor 15 or the third resistor 18. Oscillators which do not generate rectangular waveforms can also be used.

If the oscillator generates a sinusoidal or other non-rectangular waveform, the waveform generator illustrated in FIG. 1 can be readily made to function if the first NAND gate 19 and the binary counter 13 are provided with suitable threshold sensitive circuitry.

Although NAND gates are used in the embodiment described, other forms of logic gates can be readily used if suitable changes are made to the logic circuitry, (e.g. AND, NOR, OR). Furthermore, the transistor switch may be replaced by other electrical or electronic devices and even a relay if the frequency of the generated waveform is sufficiently low.

What is claimed is:

1. A waveform generator comprising:

a. a frequency variable oscillator for generating a periodic signal voltage, b. a frequency divider for dividing the periodic signal by choosen integer, said frequency divider having an input terminal, responsive to the periodic signal voltage generated by the oscillator, and an output terminal, c. a switch means having a conducting and a non-conducting state and having a control element, for selecting one of said states, the frequency divider output terminal being connected to the control element for changing the state of conduction of the switch means in accordance with a change in a voltage level appearing at said output terminal, d. means for alternately changing the period of the periodic signal voltage from a first period to a second period as the state of said switch means is alternately changed from the conducting to the nonconducting state, whereby an output voltage having positive and negative transitions defining a waveform, with a mark-to-space ratio dependent on the ratio of the first to second periods of the periodic signal voltage is generated at the output terminal of the frequency divider said transitions occurring substantially in phase with the periodic signal voltage.

2. A waveform generator comprising:

a. a capacitor controlled oscillator for generating a signal voltage with a rectangular waveform, the rectangular waveform having a first period dependent on a first capacitor, b. a binary counter having a counter input terminal and a counter output terminal, said input being responsive to the signal voltage generated by said oscillator, c. a transistor switch, the base of said switch being connected to said output terminal for changing the state of conduction of the transistor switch in accordance with a change in voltage level appearing at said output terminal, d. a second capacitor in series with the collectoremitter junction of the transistor switch for alternately changing the period of the rectangular waveform from the first period to a second period by alternately connecting the second capacitor in parallel with the first capacitor as the transistor switch is alternately switched into and out of conduction, whereby an output voltage having a rectangular waveform with a desired mark-to-space ratio is generated at the output terminal of the binary counter.

3. The invention as defined in claim 2 further comprising:

an electronic gate for gating the signal voltage of said oscillator into the input terminal of the binary counter when said gate is enabled, whereby the output voltage having a rectangular waveform with the desired mark-to-space ratio appears at the output terminal of the binary counter when said gate is enabled.

4. The invention as defined in claim 2 further comprising:

a first electronic gate for gating the signal voltage of said oscillator into the input terminal of the binary counter when said gate is enabled, a second electronic gate, the second electronic gate having a first input gate terminal, a second input gate terminal and an output gate terminal, the output gate terminal of the second electronic gate being connected to enable the first electronic gate, the first input gate terminal being connected through an inverter to the output terminal of the binary counter and the second input gate terminal being arranged for connection to a control signal, whereby after the control signal is removed the output voltage at the binary counter output terminal maintains the logic states of the first and second electronic gates until the output voltage generated at the binary counter output terminal has completed a full cycle.

5. A waveform generator comprising:

a. an operational amplifier, said amplifier having an amplifier first input terminal, an amplifier second input terminal and an amplifier output terminal, b. a first dual input NAND gate, one input of the first dual input NAND gate being connected to the amplifier output terminal, c. a binary counter, said counter having a counter input terminal, a counter first output terminal and a counter second output terminal, the counter first and second output terminals being conjugate counter output terminals, the counter input terminal being connected to the output of the first dual input NAND gate;

d. a common terminal;

e. a transistor switch, the base of the transistor switch being connected to the counter first output terminal, the emitter of the transistor switch being connected to the common terminal, f. a second dual input NAND gate, having a first input gate terminal and a second input gate terminal the output of the second dual input NAND gate being connected to the other input of the first dual input NAND gate, the first input of the second dual input NAND gate being connected to the counter second output terminal and the second input of the second dual input NAND gate being arranged for connection to a control potential;

g. a first resistor connecting the amplifier first input terminal to the common terminal, a second resistor connecting the amplifier first input terminal to the amplifier output terminal, and a third resistor connecting the amplifier output terminal to the amplifier second input terminal;

h. a first capacitor connecting the amplifier second input terminal to the common terminal;

i. a second capacitor connecting the collector of the transistor switch to the amplifier second input terminal, whereby an output voltage having a rectangular waveform is generated at the output terminals of the binary counter when a control potential is applied to the second dual input NAND gate.

* * * * *